(12) United States Patent
Krishnamurthi et al.

(10) Patent No.: US 12,040,763 B2
(45) Date of Patent: Jul. 16, 2024

(54) DIFFERENTIAL TUNED INDUCTOR DEVICES AND METHODS THEREOF

(71) Applicant: Intrinsix Corp., Marlborough, MA (US)

(72) Inventors: Kathiravan Krishnamurthi, Westford, MA (US); Finbarr McGrath, Chelmsford, MA (US)

(73) Assignee: Intrinsix Corp., Marlborough, MA (US)

( * ) Notice: Subject to any disclaimer, the term of this patent is extended or adjusted under 35 U.S.C. 154(b) by 570 days.

(21) Appl. No.: 17/362,015

(22) Filed: Jun. 29, 2021

(65) Prior Publication Data
US 2022/0415789 A1    Dec. 29, 2022

(51) Int. Cl.
*H03H 1/00*    (2006.01)
*H03F 3/195*   (2006.01)

(52) U.S. Cl.
CPC .............. *H03H 1/00* (2013.01); *H03F 3/195* (2013.01); *H03F 2200/294* (2013.01)

(58) Field of Classification Search
CPC .............. H03F 3/195; H03F 2200/294; H03F 3/45188; H03H 2001/005; H03H 1/00
See application file for complete search history.

(56) References Cited

U.S. PATENT DOCUMENTS

| | | | |
|---|---|---|---|
| 11,121,676 B1* | 9/2021 | Ba ........................ | H03F 3/2173 |
| 2015/0341014 A1* | 11/2015 | Wang ..................... | H03H 11/32 333/25 |
| 2019/0356348 A1* | 11/2019 | Nguyen .................. | H03F 1/223 |
| 2022/0021353 A1* | 1/2022 | Han ........................ | H01F 21/12 |

* cited by examiner

*Primary Examiner* — Patrick C Chen
(74) *Attorney, Agent, or Firm* — Mark H. Whittenberger; Holland & Knight LLP

(57) ABSTRACT

A differential tuned inductor and a multilayer tunable transformer for an integrated circuit device for microwave and RF applications are disclosed. The tunable inductor can be used in differential artificial delay lines to achieve delay tuning while preserving impedance matching. The tunable transformer can also be used for mixer drives to achieve wider operational performance.

9 Claims, 7 Drawing Sheets

DIFFERENTIAL TUNED INDUCTOR DEVICES AND METHODS THEREOF

FIELD

The present technology relates to differential tuned inductor devices and methods thereof. More particularly, the present technology relates to compact, tunable, differential inductor devices that may be employed in integrated circuit devices and methods thereof.

BACKGROUND

Delay lines are employed in many radar systems, electronic warfare (EW) systems, and test—and measurements applications. For example, in radar systems, acquired pulses can be processed and analyzed by delaying them in time. In practical communications systems, delays may be needed on a faster clock to synchronize its timing with a slower clock. In such systems, the total delay at the target frequency approaches the wavelength of delay. This means that pure transmission line implementations of delays are not practical for integrated circuits operating below 20 GHz and, even at millimeter wave frequencies, transmission lines take up considerable layout space, which is undesirable.

Artificial delay lines with series inductors and shunt capacitors on chip make delay lines practically realizable in a reasonable form factor. Differential delay lines are more practical on semiconductors processes where low impedance ground connections are not available for shunt element grounding. The shunt elements do not require low-impedance grounds in a differential delay line. A degree of electronic variability and tuning of delay and impedance will render the delay lines very attractive where accuracy and process invariance of delay and impedance is required. Artificial delay lines have been proposed that are either single-ended, differential with two single inductors, or tunable with only capacitor variation. Such delay lines are limited in their applications.

High efficiency drives are required for mixing of received radio signals. Mixers in receivers work in a harsh environment that has large blockers in the presence of small desired signals. Passive mixers with large drives are employed to improve the ability to deal with these interfering signals. Efficient large drives are generated by push-pull schemes that use transformers. These transformer based drivers can provide supply level drives to enhance receive mixer performance. However, they are limited in their operating bandwidth. Tuning the transformers can result in extending the operating bandwidth of these high performance mixers.

SUMMARY

A tunable series differential inductor section device includes a first series two port spiral coil wound with a number of turns. A second series two port spiral coil is coupled to the first series two port spiral coil, wherein the second series two port spiral coil is wound with respect to the first series two port spiral coil with an outer turn of the second series two port spiral coil positioned proximal to an inner turn of the first series two port spiral coil such that the inner turn of second series two port spiral coil ends closer to the outer turn of the first series two port spiral coil. A tertiary pair of coils is wound vertically below the first and second series two port spiral coils such that the tertiary pair of coils are coupled evenly to the first and second series two port spiral coils, wherein the tertiary pair of coils are connected to a switch having a first switch position to electrically open the tertiary pair of coils and a second switch position to electrically close the tertiary pair of coils to reduce differential inductance of the coupled first and second series two port spiral coils. A tap is provided in the tertiary pair of coils to bias the switch.

A method of making a tunable series differential inductor section device includes providing a first series two port spiral coil wound with a number of turns. A second series two port spiral coil is coupled to the first series two port spiral coil, wherein the second series two port spiral coil is wound with respect to the first series two port spiral coil with an outer turn of the second series two port spiral coil positioned proximal to an inner turn of the first series two port spiral coil such that the inner turn of second series two port spiral coil ends closer to the outer turn of the first series two port spiral coil. A tertiary pair of coils is provided wound vertically below the first and second series two port spiral coils such that the tertiary pair of coils are coupled evenly to the first and second series two port spiral coils, wherein the tertiary pair of coils are connected to a switch having a first switch position to electrically open the tertiary pair of coils and a second switch position to electrically close the tertiary pair of coils to reduce differential inductance of the coupled first and second series two port spiral coils. A tap is provided in the tertiary pair of coils to bias the switch.

An electronically tunable transformer circuit device includes a first layer comprising two pairs of magnetically coupled inductors each comprising a primary inductor and a secondary inductor, wherein terminals of the primary inductors and the secondary conductors are connected together to provide a five-port configuration. A tap is located at a mid-point of a connection between the two primary inductors. A second layer is located beneath the first layer, the second layer comprising a pair of tertiary coils having switches configured to open and close the pair of tertiary coils to effect tuning of the transformer.

Examples of the present technology provide fully differential tunable transformers. For example, the present technology may be employed in microwave and millimeter wave artificial delay lines, as a tunable transformer based driver amplifier, or as a tunable transformer for an input mixer balun. The inductor variation is done by switching a set of coupled coils in and out. This additional conductor is not in the direct path of the signal. In this configuration, in the delay line context, the inductance per unit length of the delay line can be improved by approximately 40%. As a tunable transformer based driver amplifier, tuning the transformer results in moving the peak linearity response of the mixer in the frequency axis, and moving the optimum conversion loss response of the mixer in the frequency axis.

Examples of the present technology also provide a compact and fully differential tunable inductor that can be employed in a number of applications. The disclosed tunable inductor advantageously does not require any low-impedance ground vias, allows for broad band, flexible tunability. In one example, the tunable inductor of the disclosed technology may advantageously be utilized for multi-bit tunable delay.

DETAILED DESCRIPTION

Figures 1A, 1B:
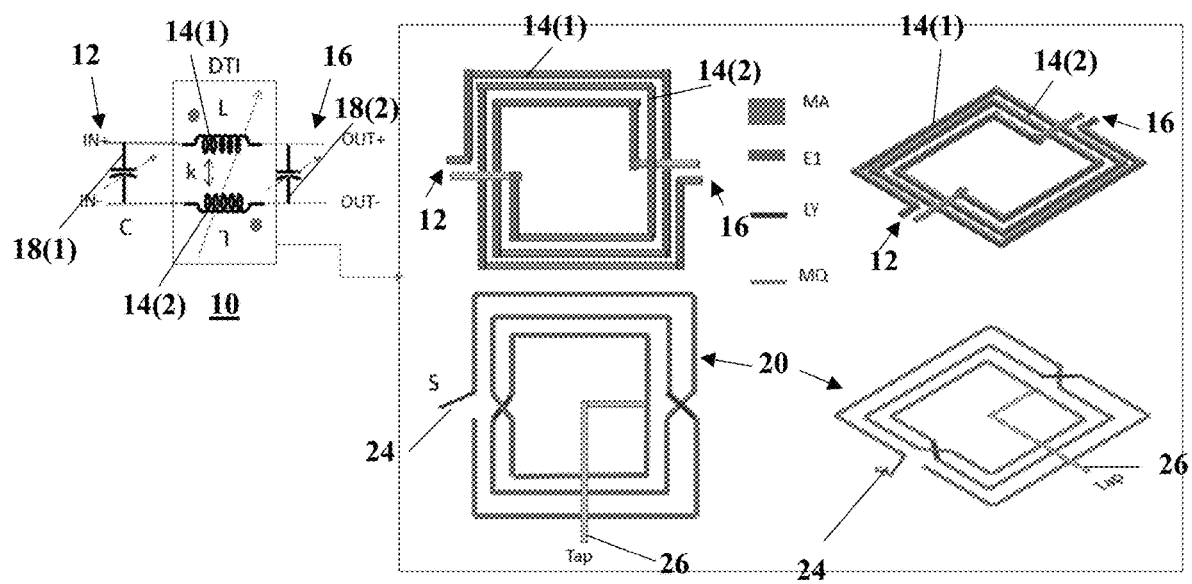
FIG. 1A is a circuit diagram of an example of a fully differential tuned inductor that may be employed, for example, in an artificial delay line section.
FIG. 1B is an exploded top view (left) and an exploded perspective view (right) of the elements of the fully differential tuned inductor shown in FIG. 1A.

An exemplary differential tuned inductor 10 that, in one example, may be employed in a tunable delay line for an integrated circuit device is illustrated in FIGS. 1A and 1B, although the differential tuned inductor 10 may be employed in other uses as described herein. The differential tuned inductor 10 includes input terminals 12, a pair of variable inductors 14(1) and 14(2), output terminals 16, a pair of variable capacitors 18(1) and 18(2), and a conductor 20 (conductor 20 is located below variable inductors 14(1) and 14(2) and is not shown in FIG. 1A), although the differential tuned inductor 10 may include other type and/or numbers of other devices, components, and/or other elements in other configurations. The differential tuned inductor 10 is a three-dimensional structure that may be employed in a number of applications as described herein. For example, the differential tuned inductor 10 can be used an element in an artificial delay line to switch delays and save area by having more inductor per unit length than a single-ended tunable inductor. In another example, the differential tuned inductor 10 can be used as a section in push-pull drivers for mixer drives to provide two bands of high linearity and low loss mixer performance. In yet another example, the differential tuned inductor 10 can be used as a section in balun for mixers to replace a larger lossy balun to yield broadband response. Although several uses for the differential tuned inductor 10 are described, it is to be understood that the differential tuned inductor 10 can be employed in other use cases in integrated circuit devices.

As discussed above, in one example, the differential tuned inductor 10 of the present technology may be employed in an artificial delay line section that may be utilized for various applications that require microwave and millimeter wave artificial delay lines. In one example, the differential tuned inductor 10 may be cascaded with additional differential tuned inductors. The present technology advantageously provides a differential tuned inductor 10 that may be used, in one example, to form a compact, tunable, differential delay line. In this example, the differential tuned inductor 10 advantageously improves inductance per unit length of the delay line in which the artificial delay line section including the differential tuned inductor 10 is employed. The present technology further allows for a fully tunable delay line including the differential tuned inductor 10 that also is more compact with decreased loss. The differential tuned inductor 10 of the present technology with right modifications, may also be employed, for example, in mixer linearity (IP3) and conversion loss (CL) tuning as a tunable transformer.

Figure 2:
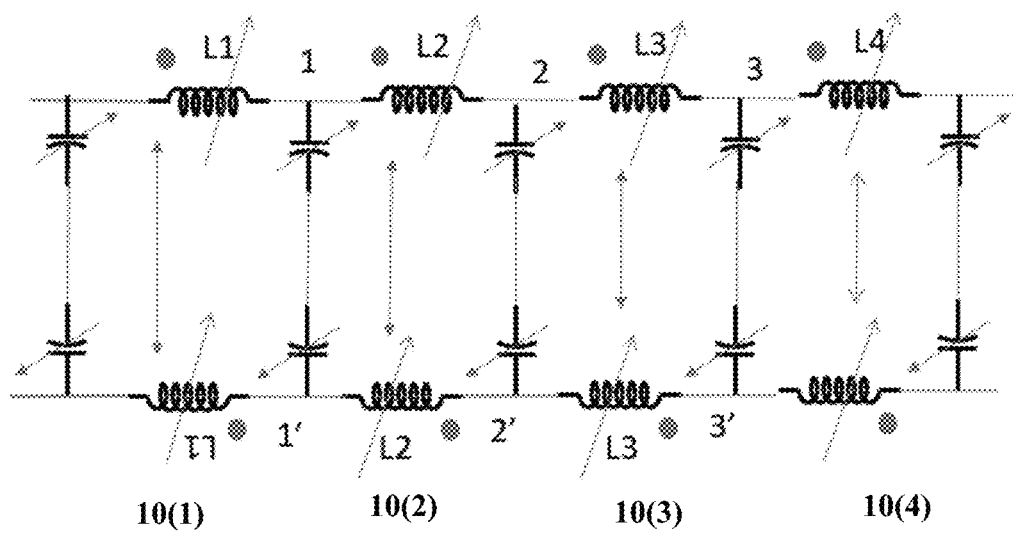
FIG. 2 is an exemplary implementation of cascaded artificial delay line sections using the differential tuned inductor.

Referring again to FIGS. 1A and 1B, the differential tuned inductor 10 includes the input terminals 12 that are configured to receive a signal. In one example, the differential tuned inductor 10 may be an artificial delay line that is cascaded with other artificial delay line sections to form an artificial delay line as shown in FIG. 2. The received signal may be a microwave or millimeter wave signal, although the differential tuned inductor 10 may be employed with other types and/or numbers of signals.

Referring again to FIGS. 1A and 1B, the pair of coupled inductors 14(1) and 14(2) are coupled to the input terminals 12. In this example, the pair of coupled inductors 14(1) and 14(2) include a first series two port spiral coil wound with an odd number of turns with inner and outer turns pointing in opposite directions and a second series two port spiral coil coupled to the first series two port spiral coil. The second series two port spiral coil is wound with respect to the first series two port spiral coil with an outer turn of the second series two port spiral coil positioned proximal to an inner turn of the first series two port spiral coil such that the inner turn of second series two port spiral coil ends closer to the outer turn of the first series two port spiral coil, although other configurations may be employed.

In this example, the pair of coupled inductors 14(1) and 14(2) provide plus and minus side inductors that are equal in value to maintain symmetry and are varied by a common-control that changes both the plus and minus inductors 14(1) and 14(2) simultaneously by equal amounts. In one example, the plus and minus side inductors 14(1) and 14(2) are coupled spiral inductors, although other configurations may be employed. In this example, the pair of coupled inductors 14(1) and 14(2) are located on a first side of a metal structure. In one example, the plus and minus inductors are arranged in a planar fashion on the top metal of metal structure with a bottom metal underpass. The spiral inductors that form the pair of coupled inductors 14(1) and 14(2) can be formed as a wire trace on a chip, for example. Each of the segmented inductors of the pair of coupled inductors 14(1) and 14(2) in this configuration (i.e., the plus and minus side inductors) benefits from the coupling, as one gets a boost in inductance from the other as a result of the coupling. Effectively, the inductance in each of the inductors 14(1) and 14(2) is increased by the factor of its coupling with the adjacent line. This property of the differential inductance allows higher inductance per unit length, and also reduces the length needed and saves area when employed in an artificial delay line, for example.

Output terminals 16 are coupled to the pair of coupled inductors 14(1) and 14(2) to output the signal depending on the application. In one example, the differential tuned inductor 10 is used as an artificial delay line and the output signal received at the output terminal 16 may have a variable delay value that is switchable between about 3.5 ps and about 6.6 ps, although other delays may be employed. In one example, the differential tuned inductor 10 may be cascaded with other artificial delay line sections to form an artificial delay line as shown in FIG. 2.

Referring again to FIGS. 1A and 1B, a pair of variable capacitors 18(1) and 18(2) are located on the input terminals 12 and the output terminals 16, respectively. The pair of variable capacitors 18(1) and 18(2) provide input and output capacitors that are tunable to a high or low state. Both the inductance and capacitance are tuned to get tuning of the differential tuned inductor 10 (with impedance matching), as described below. In one example, the pair of variable capacitors 18(1) and 18(2) are varactors. In one example, the pair of variable capacitors 18(1) and 18(2) at the input terminal 12 and the output terminal 16, respectively, set the impedance and vary the delay at the same time when the differential tuned inductor 10 is employed in an artificial delay line as shown in FIG. 2.

The differential tuned inductor 10 further includes a third conductor 20. In one example, the third conductor 20 is a tertiary pair of conductor coils. In one example, the third conductor 20 or tertiary pair of coils is a spiral pair that is wound below the top metal of metal structure 22 and evenly coupled to the top metal of metal structure (not shown). The third conductor 20 or tertiary pair of coils includes a switch 24 configured to place the pair of variable capacitors 18(1) and 18(2) in one of a high capacitance or a low capacitance state to provide adjustable tuning for the differential tuned inductor 10 (with impedance matching). The switch 24 can be a p-i-n diode, a FET switch, or a varactor, by way of example only. In one example, the adjustable tuning is employed to provide a variable delay value for the differential tuned inductor 10, although in other examples the differential tuned inductor 10 may be employed as a tunable transformer based driver amplifier, as described in further detail below. By way of example, the differential tuned inductor 10 can also be used for analog tuning by replacing the switch 24 with a variable capacitor, such as a varactor. In one example, the third conductor 20 or tertiary pair of coils further comprises a tap 26 configured to bias the switch 24. In this example, the third conductor 20 or tertiary pair of coils is not in communication with the input terminal 12 or the output terminal 16, i.e., the third conductor 20 or tertiary pair of coils is not in the signal path.

FIG. 2 illustrates an artificial delay line section 30 that includes a plurality of differential tuned inductors 10(1)-10(4) cascaded together. Although four differential tuned inductors are shown, it is to be understood that any number of differential tuned inductors of the present technology may be employed in a cascaded configuration. Each of the differential tuned inductors 10(1)-10(4) advantageously can be used an element to switch delays, and also save area by having more inductance per unit length than a single-ended tunable inductor.

Figure 3:
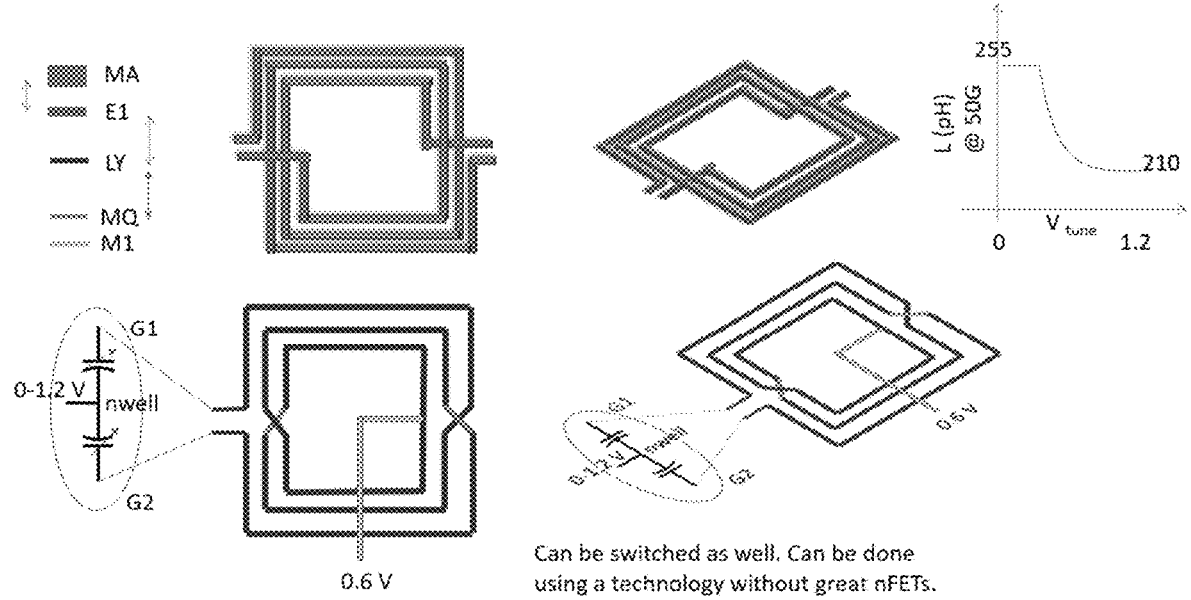
FIG. 3 is a circuit diagram of an exemplary implementation of an analog version of a fully differential tuned inductor.

Referring now to FIG. 3, the tunable nature of the differential tuned inductor 10 disclosed can be analog as well. The differential tuned inductor 10 in this example has the same structure and operation as described with respect to FIGS. 1A and 2 except as described below. In this example, the switch 24 is a MOS varactor instead of a FET or pin switch. The capacitance of the MOS varactor can be varied from Cmax-Cmin. In this example, the effective differential inductance, as described with respect to the example above, can advantageously be continuously tuned at a given frequency.

An exemplary operation of the differential tuned inductor 10 illustrated in FIGS. 1A and 2 as a delay line will now be described. In operation, the switch 24 of the third conductor 20 is in an open state. In one example, the tap 26 biases the switch 24 to the open configuration. In this configuration, the differential tuned inductor 10 has a characteristic impedance set by the pair of inductors 14(1) and 14(2) and the pair of capacitors 18(1) and 18(2). In this configuration, the differential tuned inductor 10 is in a high state. In the example of a delay line section, when the switch 24 is in the open state, the delay is in high state ($t_d$_high) as a result of the increased capacitance and low reverse voltage bias on the pair of capacitors 18(1) and 18(2). In the delay line application, for a low delay state, the switch 24 of the third conductor 20 is closed. The effective inductance of the delay path is reduced and the pair of conductors 18(1) and 18(2) are switched to maintain the characteristic impedance. When the switch 24 is closed, the effective inductance of the delay path is reduced such that the delay is in a low state ($t_d$_low). In one example, the output signal may have a variable delay value that is switchable between about 3.5 ps and about 6.6 ps.

Figure 4:
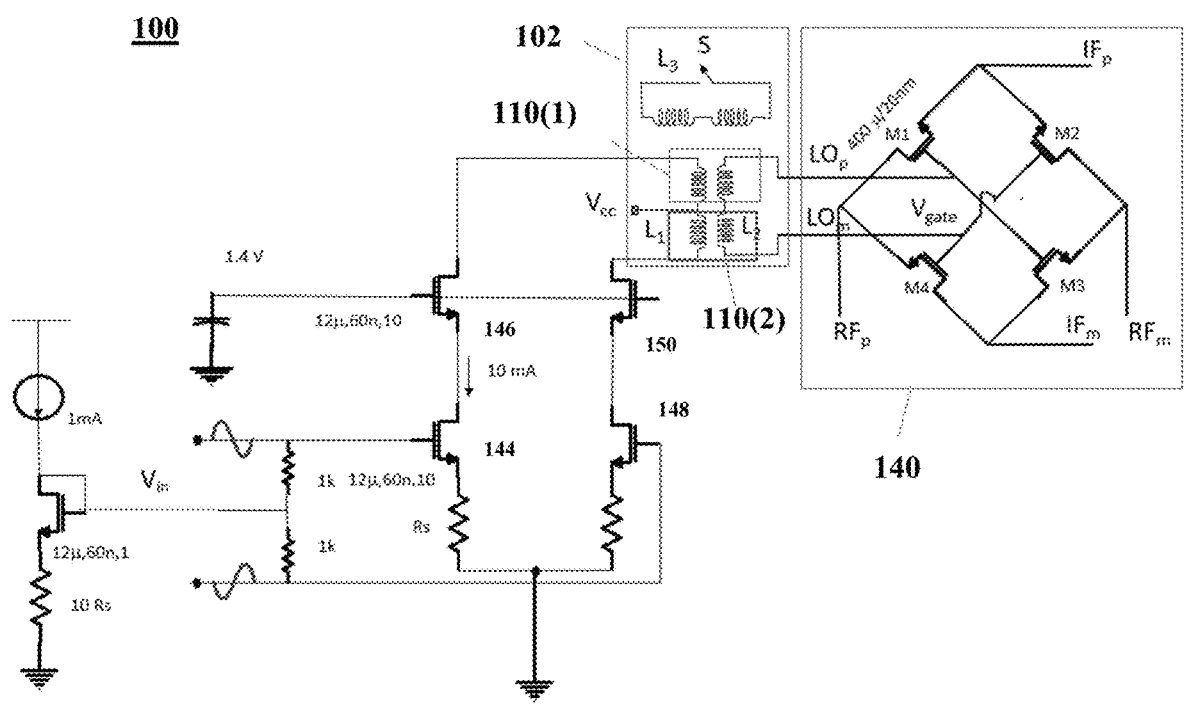
FIG. 4 is an exemplary diagram of an implementation of the fully differential tuned transformer in a tunable driver amplifier.

Referring now to FIG. 4, in another example, the present technology is employed in a tunable transformer based local-oscillator driver amplifier circuit 100. In this example, a differential tunable inductor section 102 is employed with two differential tuned inductors 110(1) and 110(2) with an additional center-tap 126 at one of the coupled inductors. This configuration can be utilized for a driver application. The center-tap 126 is used to inject the supply to the drains (or collectors in the case of bipolar technology). A number of high linearity FET mixers with very high compression and intercept points have been developed. These mixers have passive mixer quad cores, such as mixer core 140 driven by push-pull drivers that swing a large peak voltage into the gates.

Radio receivers working in microwave and millimeter wave bands need to process weak signals in the presence of stronger interferers. This requirement demands low-noise and distortion performance from associated mixers. Low distortion and noise are achieved in passive FET (Field Effect Transistors) mixers with drive voltages that are close to peak allowed peak gate voltages. Push-pull amplifiers with open collectors (drains) are used to drive voltage swings that maximize linear performance and reduce conversion loss (noise). In one example, the differential tunable inductor section 102 of the present technology can be used on the collector outputs to extend the bandwidth of efficient drivers at microwave frequencies.

The ability to drive the mixer core 140 to present the correct dynamic conductance and optimum linearity requires maximizing the signal voltage swing at the gates of the FET quad core 140. Signal voltage swings of 2.5 to 5 V translate to LO power levels of approximately 18 to 24 dBm, when referenced to a 50Ω characteristic impedance. The magnitude of this LO voltage swing can be controlled in an integrated circuit (IC) implementation of the mixer quad-core 140 by using a resonated amplifier technique, as shown in FIG. 4.

In this technique, the gate (Vgate) of the mixer quad core 140 is seen as a load that can be resonated by the tank connected to the open-collector of a cascode 142 or CE/CS differential BJT (or MOS) pair 144, 146, 148, 150, as shown in FIG. 4. A variant of this approach uses an n:n+1 transformer that can boost (step-up) the voltage drive into the mixer. This approach allows additional flexibility by allowing for the optimum LO signal swing at the mixer core 140 to be treated somewhat separately to the peak signal magnitude at the output of the LO amplifier. In this example, MOS (Metal Oxide Semiconductor) devices 144, 146, 148, 150 are used in cascode 140 configuration to ameliorate the breakdown effects and improve the high-frequency performance.

The peak drive into the gates has a frequency response shaped by the resonance of the differential drive balun with the gate capacitance of the FETs. This limits the peak drive frequency band to a fractional bandwidth of 30% of the center local oscillator band. This would directly translate to peak compression and intercept point (linearity) performance over a narrow bandwidth. Nominally, a 4-8 GHz mixer would suffer in compression performance at the 8-12 G band. Nominally, this would require two separate silicon chips to cover both 4-8 GHz and 8-12 GHz bands. Using this tuning technique with the coupled tunable inductor section 102 achieves a wider band linear mixer covering both 4-8 GHz and 8-12 GHz with one silicon chip. Using the switchable coupled transformer made of DTIs 110(1) and 110(2) allows for efficient and wideband performance simultaneously.

Figure 5:
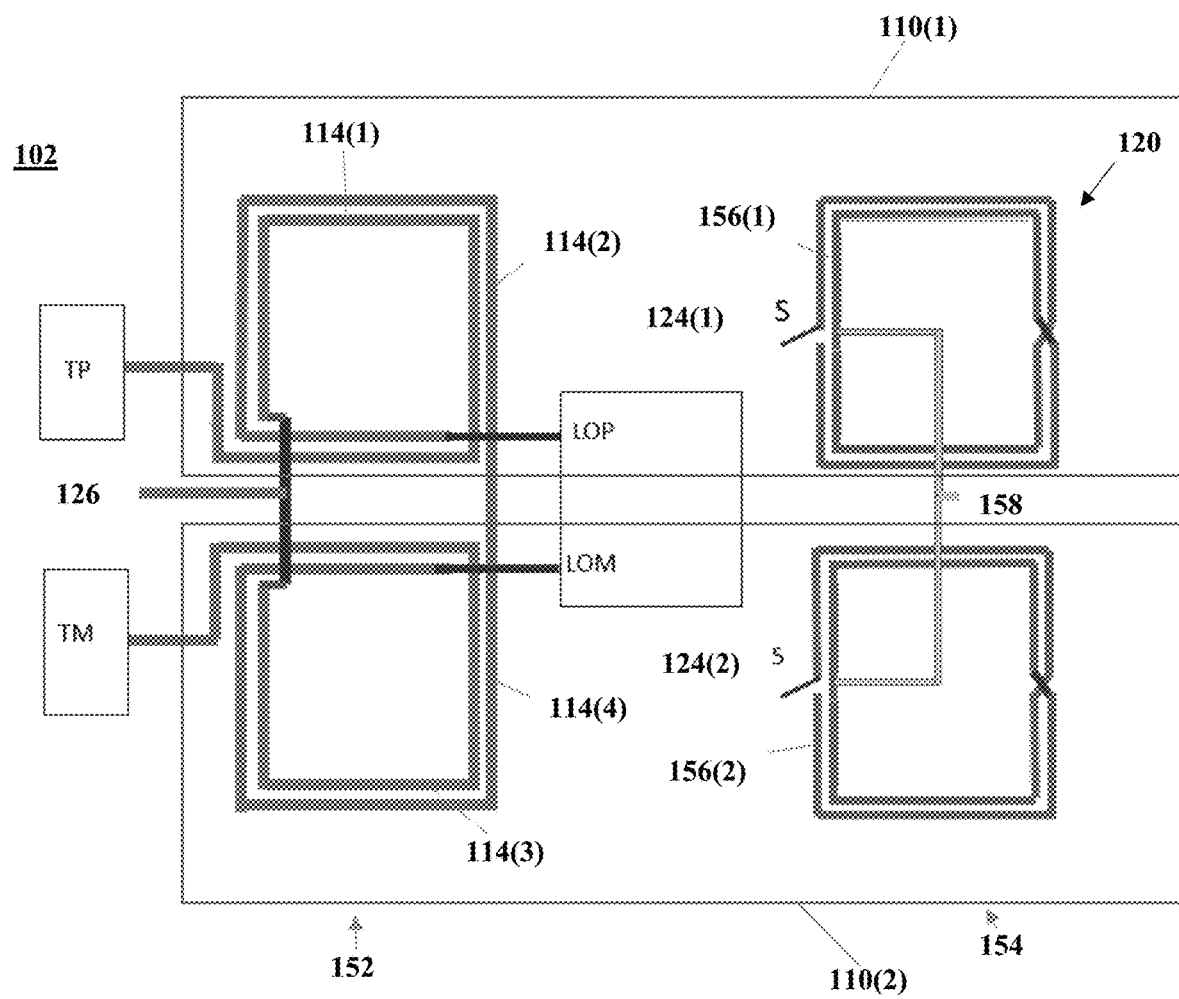
FIG. 5 is an expanded view of the diagram of the fully differential tuned transformer shown in FIG. 4.

An expanded view of the differential tuned inductor section 102 shown in FIG. 4 is illustrated in FIG. 5. As shown in FIG. 5, TP and TM illustrate the plus half and minus half of the cascode 140, respectively. The differential tuned inductor section 102 includes two differential tuned inductors 110(1) and 110(2). The differential tuned inductors 110(1) and 110(2) are the same in structure and operation as the differential tuned inductor 10 described above, except as described below. The differential tuned inductor section 102 includes a first layer 152 comprising two pairs of magnetically coupled inductors 114(1) and 114(2) and 114(3) and 114(4), respectively, each comprising a primary (drive side) inductor 114(1) and 114(3) and a secondary (mixer side) inductor 114(2) and 114(4). LOP and LOM illustrate the plus and minus local oscillator ports of the mixer 140. The terminals of the primary inductors 114(1) and 114(3) and the secondary inductors 114(2) and 114(4) are connected together to provide a five-port configuration. The tap 126 is located at the mid-point of the connection between the two primary inductors 114(1) and 114(3) to provide power supply injection. In this example, the primary terminals are connected to the driver transistor differential and the secondary terminal are connected to the local oscillator differential port of the mixer 140 as shown in FIG. 4.

Referring again to FIG. 5, a second layer 154 is located beneath the first layer 152 and includes a third conductor 120 comprising a pair of tertiary coils 156(1) and 156(2). Tertiary inductors 156(1) and 156(2) are implemented directly under the primary 114(1) and 114(3) and secondary inductors 114(2) and 114(4) as metal windings. The tertiary inductors 156(1) and 156(2) have switches 124(1) and 124(2) configured to open and close the pair of tertiary coils 156(1) and 156(2) to effect tuning of the coils located above. Tuning the transformer results in moving the peak linearity response of the mixer 140 in the frequency axis. Tuning the transformer also results in moving the optimum conversion loss response of the mixer 140 in the frequency axis, as described below. The differential tuned inductor section 102 further includes tap 126 for driver supply connection and a bias tap 158 to connect switches 124(1) and 124(2) on the tertiary inductor 120.

Figure 6:
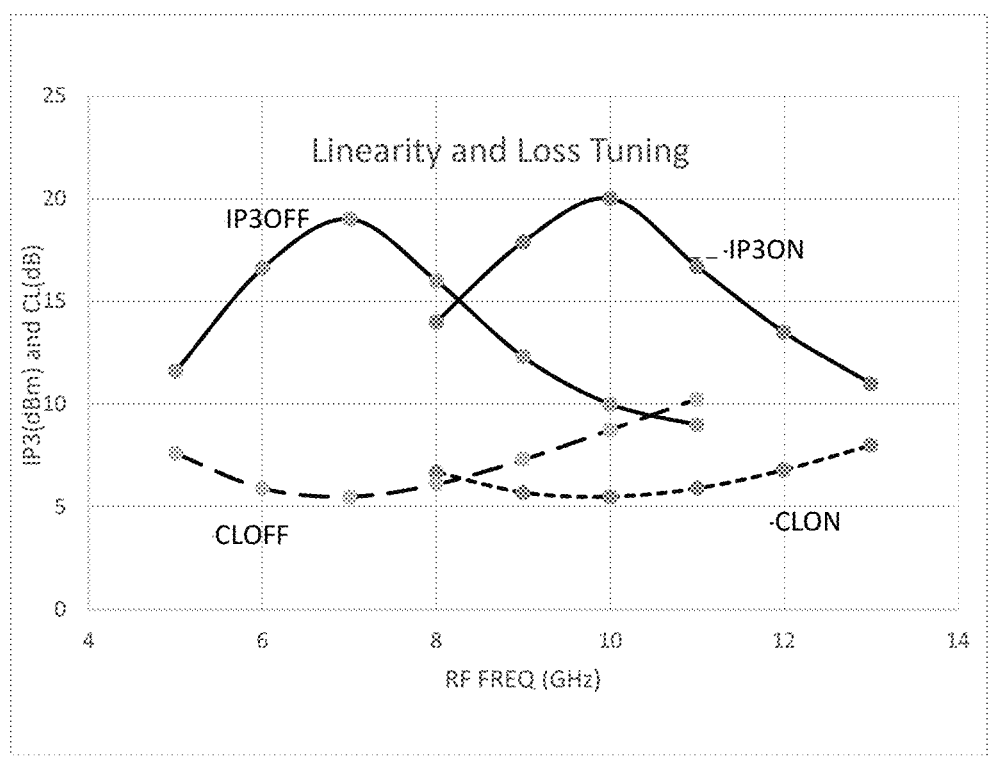
FIG. 6 is a graph of an example of sample data for linearity and loss tuning of the tunable transformer based driver amplifier shown in FIG. 4.

Illustrative performance characteristics using the coupled inductance tuning is shown in FIG. 6. Optimized peak drive response of the local oscillator drive to the mixer 140 reduces conversion loss (CL), and results in peak linearity (IP3). Nominally the coupled tuning inductor section 102 has the switch S open (OFF), the inductor sections are at their physically constructed values L1 and L2. With the switch S closed (ON), the effective inductance of the tuning coils is reduced; the resonance of the local oscillator drive response to the mixer that acts in conjunction with the mixer drive-port gate capacitance shifts to a higher band. The linearity of the passive mixer in dB milli matt IP3ON and IP3OFF is tuned from 4-8 GHz band to 8-12 GHz band. There is simultaneous reduction of conversion loss due to improved device switching resulting from the drive tuning. Conversion loss CLON and CLOFF variation is flatter and still more optimized to less than 6 dB within a larger bandwidth with the help of tuning.

Figure 7:
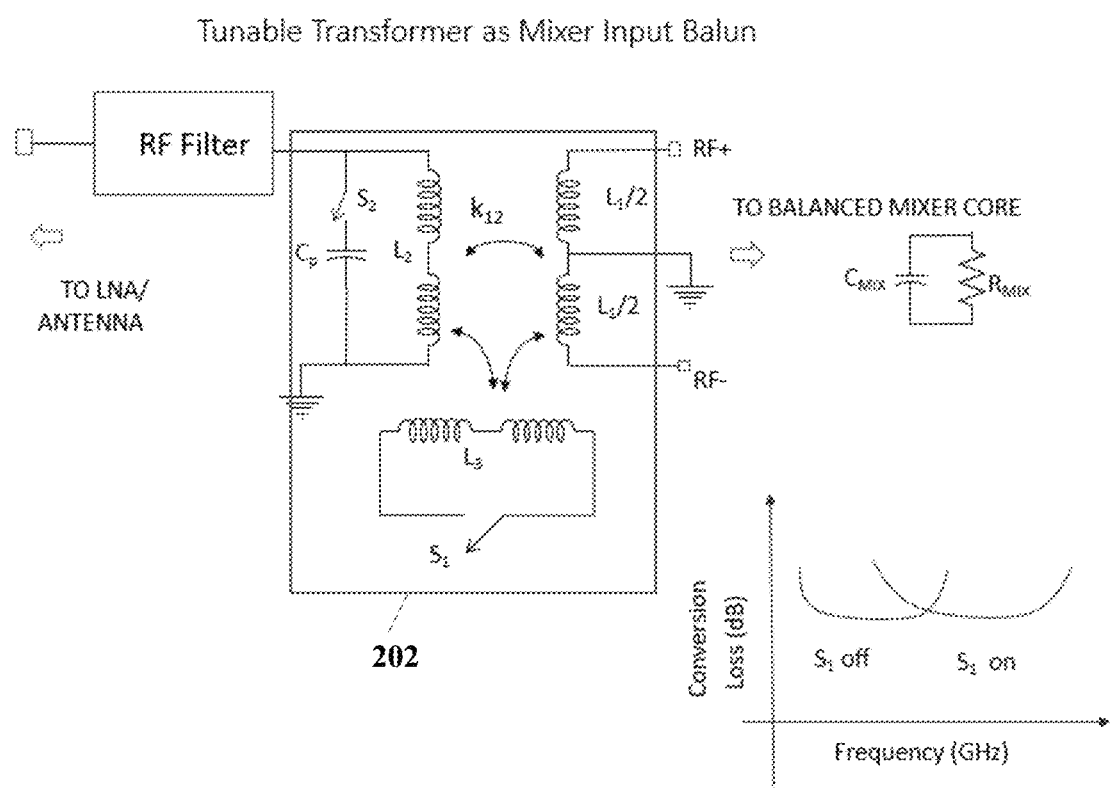
FIG. 7 is another exemplary implementation of the fully differential tuned transformer of the present technology as a tunable transformer as a mixer input balun.

Referring now to FIG. 7, in yet another example, the present technology may be employed in a tunable transformer as a mixer input balun. Baluns are used to interface differential devices to the 50 ohm single-ended world at RF and microwave frequencies, for example. Wideband baluns can be lossy and large. Differential mixers using spiral transformers are limited in bandwidth. However, using a differential tuning section 202 having two DTI (differentially tuned coupled inductors) of the present technology, wideband baluns with taps can be formed. The differential tunable inductors are the same in structure and operation as those described above.

In many double balanced mixers used in transceivers, the input thermal noise amplified by the front-end low-noise amplifier is filtered by single-ended filters before feeding the received signal to the mixer. One terminal of the transformer input (primary) is grounded and both the secondary terminals are fed to the balanced terminals of the mixer. The transformer disclosed here can be used as a balun in those applications.

A passive FET or diode mixer can be modelled as a conductance in parallel with a capacitance under drive. Many compact baluns are designed with spiral coils in integrated mixer products. Low-loss baluns are achieved by a resonance method that works well in a particular band. The loss is minimum when the mixer RF port is in resonance with the balun. However, the resonance is not very sharp; it is spread wider due to the conversion conductance of the mixer. The balun is loaded on the secondary side by a virtual conductance (1/RMIX) and capacitance CMIX of the mixer device. These baluns, many times, for practical purposes, need additional metal-insulator-metal capacitance in parallel for tuning the primary side. When the switch S1 is turned on, the effective primary and secondary inductance are reduced; L1 reduces to $L1(1-k_{13}^2)$ and L2 becomes $L2(1-k_{23}^2)$. The band is switched to the higher side. A primary capacitance Cp is switched off to extend the high side band.

Tuning of mixer conversion loss is accomplished by the example connected as shown in FIG. 7. The tap shown in the layout was used to inject the supply for the driver. In this application, the tap is grounded. One of the terminals of the primary inductor is grounded. The secondary center-tap is grounded in this application. S1=0, S2=1 position of the switch is the normal low-band operation that results in a flat conversion loss over a bandwidth of operation. The passive mixer (FET or diode) quad is a broader-band part and its frequency response performance is extended by setting S1=1. When S1=1, the magnetic coupling of the bottom coils $k_{13}$ and $k_{23}$ reduce the effective primary and secondary transformer inductances, L1 and L2 respectively. Additional tuning can be accomplished to improve the higher band conversion loss by turning off S2 in order to take Cp out of the circuit.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Additionally, the recited order of processing elements or sequences, or the use of numbers, letters, or other designations therefore, is not intended to limit the claimed processes to any order except as may be specified in the claims. Accordingly, the invention is limited only by the following claims and equivalents thereto.

What is claimed is:

1. An electronically tunable transformer circuit device comprising:
a first layer comprising two pairs of magnetically coupled inductors each comprising a primary inductor and a secondary inductor, wherein terminals of the primary inductors and the secondary conductors are connected together to provide a five-port configuration;
a tap located at a mid-point of a connection between the two primary inductors; and
a second layer located beneath the first layer, the second layer comprising a pair of tertiary coils having switches configured to open and close the pair of tertiary coils to effect tuning of the transformer.

2. The device of claim 1, wherein the switch is a PIN diode, a varactor, or a field effect transistor.

3. The device of claim 1, wherein the pair of tertiary spiral coils further comprises a tap configured to bias the switch.

4. The device of claim 1, wherein the two pairs of inductors are varied by a single control to change inductance of the two pairs of inductors by equal amounts to maintain symmetry.

5. The device of claim 1, wherein input terminals and output terminals of the two pairs of inductors are configured to be cascaded with other differential elements.

6. The device of claim 1, wherein the pair of primary terminals is coupled to a driver amplifier differential output and the pair of secondary terminals is coupled to a mixer local oscillator differential port, wherein a supply voltage is connected to the primary tap, and wherein the tuning of the device moves a peak linearity response of the mixer in a frequency axis and moving an optimum conversion loss response of the mixer in the frequency axis.

7. The device of claim 1, wherein the device is configured to be used as a balanced to unbalanced circuit or unbalanced to balanced circuit, wherein the pair of primary terminals with the tap form the balanced side and the secondary terminals are configured with one terminal as the unbalanced input and another grounded, wherein the tuning of the balun results in moving the insertion loss characteristics along the frequency axis.

8. The device of claim 7, wherein the device is configured to be used at the mixer radio frequency input to tune the conversion loss bands.

9. The device of claim 1, wherein the pair of terminals is connected to a signal source, load or differential circuit element and the other pair terminals to a signal source, load or differential circuit element to implement impedance transformation or electronic tuning of the frequency response.

* * * * *